United States Patent
Machida et al.

(10) Patent No.: US 11,777,050 B2
(45) Date of Patent: Oct. 3, 2023

(54) OPTICAL SENSOR

(71) Applicant: Panasonic Intellectual Property Management Co., Ltd., Osaka (JP)

(72) Inventors: Shinichi Machida, Osaka (JP); Takeyoshi Tokuhara, Osaka (JP); Sanshiro Shishido, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 239 days.

(21) Appl. No.: 17/238,250

(22) Filed: Apr. 23, 2021

(65) Prior Publication Data

US 2021/0265521 A1 Aug. 26, 2021

Related U.S. Application Data

(63) Continuation of application No. PCT/JP2019/044257, filed on Nov. 12, 2019.

(30) Foreign Application Priority Data

Dec. 14, 2018 (JP) .................. 2018-234785

(51) Int. Cl.
*H01L 31/112* (2006.01)
*H10K 30/35* (2023.01)
*H01L 31/0352* (2006.01)

(52) U.S. Cl.
CPC .. *H01L 31/1129* (2013.01); *H01L 31/035218* (2013.01); *H01L 31/112* (2013.01); *H10K 30/35* (2023.02)

(58) Field of Classification Search
CPC ......... H01L 31/1129; H01L 31/035218; H01L 31/112; H10K 30/35
See application file for complete search history.

(56) References Cited

U.S. PATENT DOCUMENTS

2010/0025662 A1 2/2010 Cho et al.
2015/0364545 A1* 12/2015 Heo ................... H01L 29/267
257/24

(Continued)

FOREIGN PATENT DOCUMENTS

EP 3144980 3/2017
EP 3244442 11/2017

(Continued)

OTHER PUBLICATIONS

International Search Report of PCT application No. PCT/JP2019/044257 dated Dec. 24, 2019.

(Continued)

*Primary Examiner* — David Vu
*Assistant Examiner* — Brandon C Fox
(74) *Attorney, Agent, or Firm* — McDermott Will & Emery LLP

(57) ABSTRACT

An optical sensor includes: a photosensitive layer that absorbs incident light to generate a first carrier with a first polarity and a second carrier with a second polarity different from the first polarity; a channel layer that is electrically connected to the photosensitive layer and that conducts the first carrier that has moved from the photosensitive layer; a counter electrode facing the channel layer through the photosensitive layer; an insulating layer positioned between the photosensitive layer and the counter electrode; and a source electrode and a drain electrode each electrically connected to the channel layer.

11 Claims, 12 Drawing Sheets

(56) References Cited

U.S. PATENT DOCUMENTS

| | | | |
|---|---|---|---|
| 2016/0366354 A1 | 12/2016 | Konstantatos et al. | |
| 2017/0041564 A1 | 2/2017 | Konstantatos et al. | |
| 2017/0263686 A1* | 9/2017 | Beiley | H10K 39/32 |
| 2018/0151760 A1 | 5/2018 | Tashiro | |
| 2018/0152652 A1 | 5/2018 | Tashiro | |
| 2018/0190854 A1* | 7/2018 | Bower | H01L 33/0054 |
| 2018/0204882 A1* | 7/2018 | Segawa | H01L 27/146 |
| 2018/0219047 A1 | 8/2018 | Tokuhara et al. | |
| 2019/0221686 A1* | 7/2019 | Allen | H01L 27/1443 |
| 2019/0377111 A1* | 12/2019 | Taguchi | G02B 5/208 |
| 2020/0132544 A1* | 4/2020 | Koppens | H04N 25/76 |

FOREIGN PATENT DOCUMENTS

| | | |
|---|---|---|
| JP | 2014-522117 | 8/2014 |
| JP | 2017-028682 | 2/2017 |
| JP | 2017-079462 | 4/2017 |
| JP | 2018-093263 | 6/2018 |
| JP | 2018-093297 | 6/2018 |
| JP | 2018-527742 | 9/2018 |
| WO | 2013/017605 | 2/2013 |
| WO | 2017/081831 | 5/2017 |

OTHER PUBLICATIONS

Stijn Goossens et al., "Broadband image sensor array based on graphene-CMOS integration", Nature Photonics, vol. 11, May 29, 2017, pp. 366-371.

* cited by examiner

GRAPHENE    QUANTUM DOTS

GRAPHENE    QUANTUM DOTS

OPTICAL SENSOR

BACKGROUND

1. Technical Field

The present disclosure relates to an optical sensor.

2. Description of the Related Art

For example, as disclosed in Japanese Patent No. 6021913 and S. Goossens et al., "Broadband image sensor array based on graphene-CMOS integration", Nature Photonics, 2017, Vol. 11, p. 366-371 (Non-Patent Literature 1), it is known to apply a photodetector formed using a two-dimensional material such as graphene to an image sensor.

SUMMARY

In one general aspect, the techniques disclosed here feature an optical sensor including: a photosensitive layer that absorbs incident light to generate a first carrier with a first polarity and a second carrier with a second polarity different from the first polarity; a channel layer that is electrically connected to the photosensitive layer and that conducts the first carrier that has moved from the photosensitive layer; a counter electrode facing the channel layer through the photosensitive layer; an insulating layer positioned between the photosensitive layer and the counter electrode; a source electrode electrically connected to the channel layer; and a drain electrode electrically connected to the channel layer.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION

Underlying Knowledge Forming Basis of One Aspect of the Present Disclosure

Graphene is a layered substance composed of graphite crystals of one atomic layer or more and several atomic layers or less. The electron mobility of graphene at room temperature is as high as 15000 $cm^2V^{-1}\,s^{-1}$, and the mobility of an electron and the mobility of a hole are known to be almost the same. In addition, the electric conductivity of graphene exhibits high responsiveness to an electric field in a direction perpendicular to the graphene layer. Attempts have been made to manufacture an image sensor utilizing these characteristics.

For example, Non-Patent Literature 1 discloses an image sensor including a channel layer made of graphene and a PbS quantum dot layer on a substrate having a signal readout circuit. The photoelectric conversion mechanism of the image sensor will be described below.

Figure 1A:
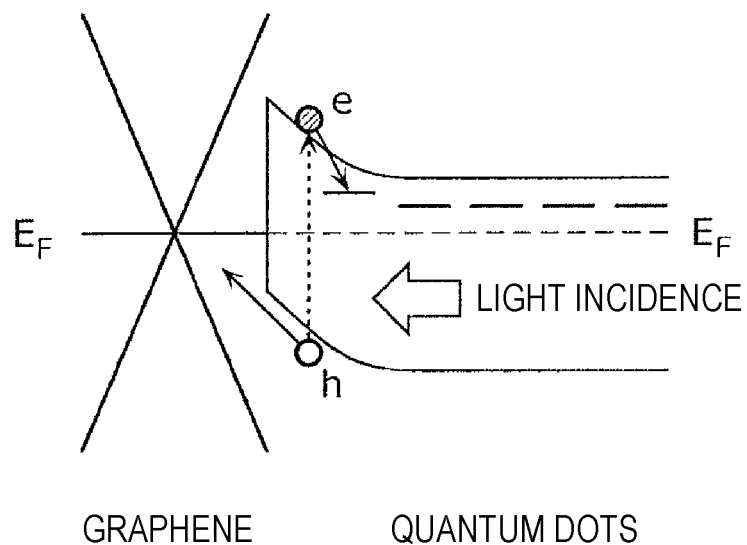
FIG. 1A illustrates an energy diagram of a bonding interface between a graphene layer and a quantum dot layer upon light incidence in a reference example.

FIG. 1A illustrates an energy diagram of a bonding interface between graphene and quantum dots upon light incidence in a reference example. In FIG. 1A, an electron is represented by a circle shaded with diagonal lines, and a hole is represented by a white circle. The same applies to other drawings representing energy diagrams, such as FIG. 1B.

In the structure described in Non-Patent Literature 1, at the bonding interface between the quantum dot layer and the graphene layer, carriers move from the quantum dot layer so that the Fermi levels $E_F$ of the two layers will be equal, and a depletion layer is formed on the quantum dot layer side of the bonding interface. In the case of using quantum dots as a photosensitive layer, the Fermi level $E_F$ may be adjusted according to a ligand used. In the case where the work function of the quantum dot layer is less than the work function of the graphene layer, electrons move from the quantum dot layer to the graphene layer, which forms an energy diagram as illustrated in 1A. In contrast, in the case where the work function of the quantum dot layer is greater than the work function of the graphene layer, electrons move from the graphene layer to the quantum dot layer, which forms a depletion layer in a direction opposite to that of FIG. 1A so that their Fermi levels $E_F$ will be equal in thermal equilibrium.

When light whose wavelength is absorbed by the quantum dot layer, which is a photosensitive layer, is incident on such a bonding interface, electron-hole pairs are generated in the quantum dot layer. In the case where a depletion layer as illustrated in FIG. 1A is formed, among the electron-hole pairs, holes move to the graphene layer due to the electric field of the depletion layer. Holes that have moved to the graphene layer are transported by the electric field between the source and the drain, applied to the graphene layer which is a channel layer, toward the contact point with the drain electrode joined to the graphene layer. Here, the source and the drain are distinguished for convenience by a direction in which holes flow; it is described that the source is the high potential side and the drain is the low potential side.

Figure 1B:
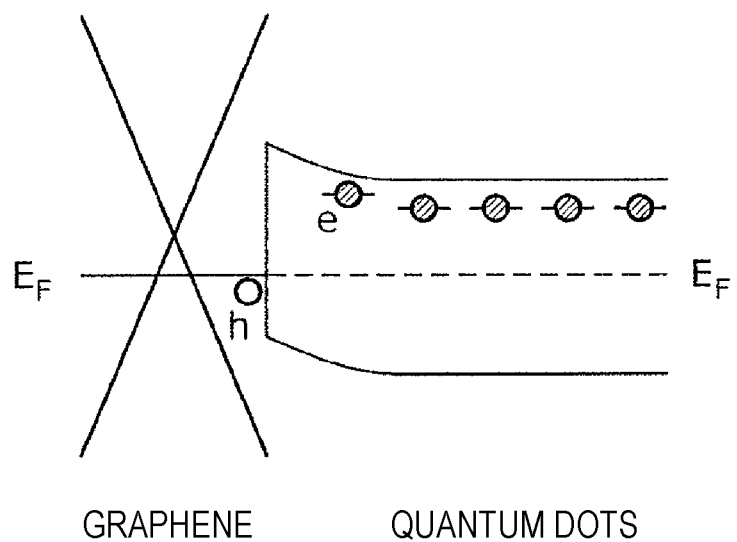
FIG. 1B illustrates an energy diagram of the bonding interface between the graphene layer and the quantum dot layer after light incidence in the reference example.

Here, in the case where a material with high carrier mobility such as graphene is used for the channel layer, electrons trapped in the quantum dot layer may remain trapped for a period of time sufficient for holes to travel through the channel layer. In such a case, as illustrated in FIG. 1B, due to an electric field generated by electrons trapped in the quantum dot layer, holes are continuously injected from the drain electrode into the graphene layer so as to satisfy the charge neutrality condition of the system. In this manner, holes continue to flow through the graphene layer until, among electron-hole pairs generated from one photon, electrons trapped in the quantum dot layer disappear as a result of recombination. That is, the signal charge for the incident photons is amplified. The effect of amplification obtained by such a mechanism is called a photoconductive gain (G), and is generally represented by the following formula (1):

$$G = \tau_L/\tau_T = \tau_L \mu V/l^2 \qquad (1)$$

Here, $\tau_L$ is the life of trapped carriers. $\tau_T$ is the traveling time of carriers traveling through the channel. $\mu$ is the mobility of carriers traveling through the channel. V is a source-drain voltage. l represents the channel length. As is clear from this formula, the photoconductive gain is improved by improving the ratio of the life $\tau_L$ of trapped carriers and the traveling time $\tau_T$ of carriers traveling through the channel.

In the image sensor, a reset operation for returning the photosensitive layer and the channel layer of each pixel back to the initial state may be performed after the signal of each pixel is detected. This is because an optical signal with less noise may be detected by detecting a signal amplified by G upon exposure to light and obtaining the difference from a signal detected immediately after the reset operation is performed. Here, Japanese Patent No. 6021913 discloses a configuration in which a gate electrode is arranged on the upper surface of a quantum dot layer. It is conceivable that, with the use of the configuration disclosed in Japanese Patent No. 6021913, voltage is applied to the gate electrode at the time of reset, thereby allowing charges trapped in the quantum dot layer to recombine and quickly cancel each out.

Figure 2A:
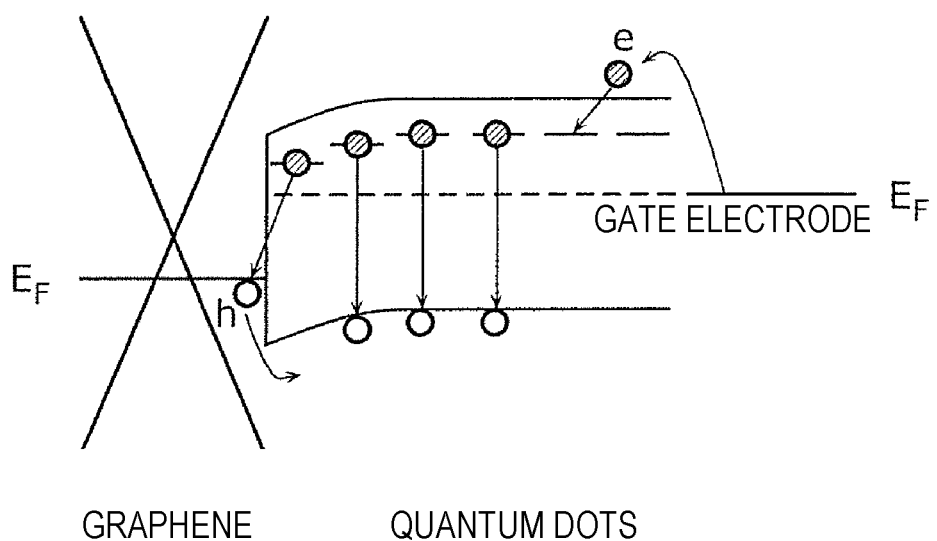
FIG. 2A illustrates an energy diagram for describing one problem that arises when the quantum dot layer is reset in the reference example.

FIG. 2A illustrates an energy diagram for describing one problem that arises when the quantum dot layer is reset in the reference example. As illustrated in FIG. 2A, holes are more easily injected from the graphene layer into the quantum dot layer by applying voltage to the gate electrode to generate an electric field. In doing so, holes injected into the quantum dot layer and electrons trapped in the quantum dot layer may be effectively recombined.

However, as illustrated in FIG. 2A, at the same time as holes are injected from the graphene layer into the quantum dot layer, new electrons may be injected from the gate electrode into the quantum dot layer. In response to injection of electrons from the gate electrode as above, it becomes difficult to effectively return the quantum dot layer back to the initial state. In the case where electrons remain in the quantum dot layer even after the reset, holes are continuously injected from the source electrode into the graphene layer until the electrons disappear as a result of recombination, and this may cause noise.

In addition, the phototransistor structure described in Non-Patent Literature 1 has room for further improvement from the perspective of improvement of the photoconductive gain, reduction of noise, and response speed. As indicated by formula (1), the photoconductive gain is determined by the ratio of the life of trapped carriers and the traveling time of carriers traveling through the channel.

Figure 2B:
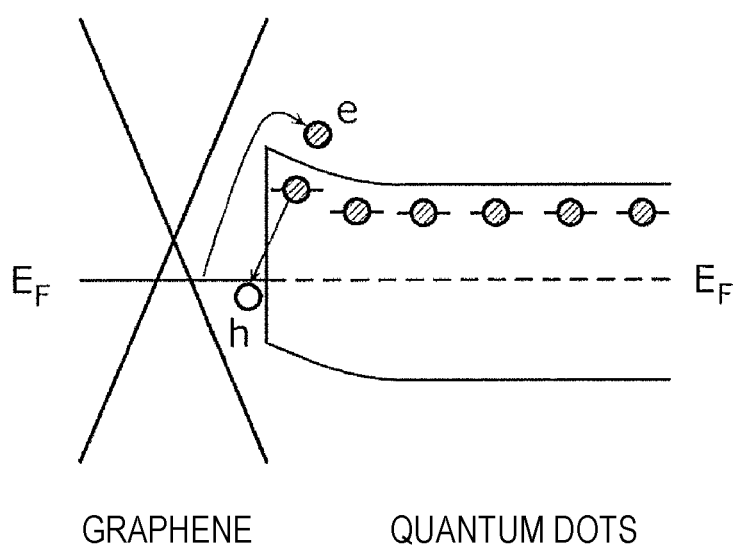
FIG. 2B illustrates an energy diagram for describing one problem that arises in the dark or after light incidence in the reference example.

FIG. 2B illustrates an energy diagram for describing one problem that arises in the dark or after light incidence in the reference example. In the structure described in Non-Patent Literature 1, the graphene layer in which holes travel and the quantum dot layer in which electrons are trapped directly contact each other. Therefore, as illustrated in FIG. 2B, electrons may be injected from the graphene layer into the quantum dot layer in the dark where there is no incidence of light. At this time, because holes remain in the graphene layer after electrons have escaped, holes continue to flow in the graphene layer, as in the case where holes are injected from the quantum dot layer into the graphene layer. That is, even though there is no incident light, the multiplication phenomenon of carriers traveling through the channel occurs. The closer the Fermi level of the graphene layer and the conduction band of the quantum dot layer, the higher the probability that electrons in the graphene layer are thermally excited and injected into the quantum dot layer. Therefore, in the case where a photosensitive layer with a narrow bandgap is used for the purpose of imaging long-wavelength light such as near-infrared light, noise tends to increase in the dark.

In addition, upon light incidence, as illustrated in FIG. 2B, trapped electrons tend to recombine with holes traveling in the channel layer. Therefore, the life of the trapped electrons may be shortened, giving rise to a problem that the photoconductive gain may not be obtained as expected.

In addition, as represented by formula (1) mentioned above, it is effective to extend the life of the trapped electrons in order to improve the photoconductive gain. However, in the structure described in Non-Patent Literature 1, the response speed of each pixel depends on the time taken by the trapped electrons to recombine spontaneously due to their life. In short, it is desirable to shorten the life of the trapped carriers in order to increase the response speed; however, if the life of the trapped carriers is shortened, the photoconductive gain becomes smaller. In this manner, it is difficult to improve both the photoconductive gain and the response speed at the same time.

The inventors of the present disclosure have investigated the problems in the above-described reference example and conceived the configuration of the present disclosure. Hereinafter, embodiments of the present disclosure will be described with reference to the drawings. These embodiments are not construed to limit the scope of the present disclosure, but are provided for illustrative purposes only. For example, a mode in which quantum dots are used as a photosensitive layer and graphene is used as a channel layer will be discussed in order to describe the basic mechanism.

However, the embodiments described below may be applied to the case in which other materials are used for the photosensitive layer or the channel layer.

An optical sensor according to an aspect of the present disclosure includes: a photosensitive layer that absorbs incident light to generate a first carrier with a first polarity and a second carrier with a second polarity different from the first polarity; a channel layer that is electrically connected to the photosensitive layer and that conducts the first carrier that has moved from the photosensitive layer; a counter electrode facing the channel layer through the photosensitive layer; an insulating layer positioned between the photosensitive layer and the counter electrode; a source electrode electrically connected to the channel layer; and a drain electrode electrically connected to the channel layer.

Accordingly, the injection of the second carrier from the counter electrode into the photosensitive layer may be suppressed upon reset. Therefore, the second carrier trapped in the photosensitive layer may be recombined with the first carrier supplied from the channel layer, thereby effectively resetting the photosensitive layer. Therefore, for example, the first carrier or the second carrier remaining in the photosensitive layer may be prevented from being injected into the channel layer to cause noise. In this manner, according to the present aspect, the optical sensor with reduced noise may be provided.

By applying a certain potential to the counter electrode, an electric field may be formed between the photosensitive layer and the channel layer, which makes it easier for the first carrier to be injected from the channel layer into the photosensitive layer upon reset. This promotes the recombination of the first carrier injected from the channel layer and the second carrier trapped in the photosensitive layer, thereby shortening the time required for reset. Therefore, the response speed of the optical sensor may be increased.

Since the injection of the first carrier from the counter electrode into the photosensitive layer may be suppressed upon exposure to light, recombination of the first carrier injected from the counter electrode and the second carrier trapped in the photosensitive layer may be suppressed. This extends the life of the trapped second carrier, thereby improving the photoconductive gain.

Furthermore, upon exposure to light, the second carrier generated in the photosensitive layer may not be able to move to the counter electrode due to the insulating layer, and thus the second carrier is trapped in the photosensitive layer. Therefore, the photosensitive layer does not necessarily need to have a trap site, and accordingly the degree of freedom in selecting a material usable for the photosensitive layer may be increased.

For example, the optical sensor according to an aspect of the present disclosure may further include a carrier selecting layer that is positioned between the channel layer and the photosensitive layer and that suppresses movement of the second carrier from the channel layer to the photosensitive layer.

Accordingly, the carrier selecting layer suppresses the injection of the second carrier from the channel layer into the photosensitive layer in the dark. Suppose the case where the second carrier is injected from the channel layer into the photosensitive layer. This case is equivalent to the case where the first carrier is injected from the photosensitive layer into the channel layer, which means that the first carrier continuously flows in the channel layer to cause noise. In contrast, according to the optical sensor according to the present aspect, because the injection of the second carrier from the channel layer into the photosensitive layer is suppressed, noise may be reduced.

Upon exposure to light, the carrier selecting layer suppresses the recombination of the first carrier traveling through the channel layer and the second carrier trapped in the photosensitive layer. Therefore, because the life of the second carrier trapped in the photosensitive layer is extended, the photoconductive gain may be improved.

The optical sensor according to an aspect of the present disclosure may further include a voltage supply circuit that supplies a first voltage to the counter electrode in a first period, and that supplies a second voltage different from the first voltage to the counter electrode in a second period different from the first period.

This allows different electric fields to be applied in the photosensitive layer when the optical sensor is exposed to light and when the optical sensor is reset. Since the movement of carriers may be promoted by an electric field, the time required for exposure to light and reset may be shortened. In this manner, according to the optical sensor according to the present aspect, the response speed may be increased.

In addition, for example, the channel layer may contain at least one selected from the group consisting of graphene, phosphorene, transition metal dichalcogenide, hexagonal boron nitride, and organic semiconductor.

Accordingly, because the first carrier multiplication effect may be sufficiently exerted, the optical sensor with a high photoconductive gain may be realized.

In addition, for example, the photosensitive layer may include a trap site that traps the second carrier.

Accordingly, because it becomes difficult for the second carrier trapped in the trap site to move freely, the probability of recombination with the first carrier in the photosensitive layer is reduced. Therefore, because the life of the second carrier is extended, the photoconductive gain may be improved.

In addition, for example, the photosensitive layer may include a quantum dot. In addition, for example, the quantum dot may contain at least one selected from the group consisting of Ge, CdSe, CdS, PbS, PbSe, PbTe, ZnO, ZnS, $Cu_2ZnSnS_4$ (CZTS), $Cu_2S$, $Bi_2S_3$, $Ag_2S$, HgTe, CdHgTe, InAs, and InSb.

Accordingly, high sensitivity to weak light may be realized.

In addition, for example, at least part of a surface of the quantum dot may be oxidized.

Accordingly, because a trap site may be formed in the photosensitive layer, the life of the second carrier may be extended. Therefore, the photoconductive gain of the optical sensor may be further increased.

In addition, for example, the photosensitive layer may include a carbon nanotube.

Accordingly, high sensitivity to weak light may be realized. In particular, high sensitivity to infrared light may be realized.

In addition, for example, a wavelength range of light absorbed by the photosensitive layer may include a first wavelength range and a second wavelength range that is outside the first wavelength range, a transmittance of the insulating layer for light in the first wavelength range may be 10% or greater, and a transmittance of the insulating layer for light in the second wavelength range may be less than 10%.

Accordingly, because the insulating layer may transmit only effective light that should be received by the photosensitive layer, narrow-band imaging may be realized.

In addition, for example, the photosensitive layer and the channel layer may be configured so that the first carrier moves from the photosensitive layer to the channel layer.

Hereinafter, embodiments of the present disclosure will be specifically described with reference to the drawings.

Note that all the embodiments described below illustrate comprehensive or specific examples. Numerical values, shapes, materials, components, the arrangement positions and connection configuration of components, steps, the order of steps, and so forth described in the following embodiments are only exemplary and are not intended to limit the present disclosure. In addition, among the components in the following embodiments, components that are not described in independent claims are described as arbitrary components.

In addition, the drawings are schematic diagrams and are not necessarily strictly illustrated. Therefore, for example, the scales and the like in the drawings do not necessarily match. In addition, substantially the same configurations are given the same reference symbol in the drawings, and overlapping descriptions are omitted or simplified.

In the present specification, a term for the relationship between elements, a term for the shape of an element, and a numerical range are not expressions expressing only strict meanings, but are expressions meaning that they include substantially equivalent ranges, such as a difference of about a few percent.

In addition, in the present specification, the terms "upper" and "lower" do not refer to an upward direction (vertically upward) and a downward direction (vertically downward) in absolute space recognition, but are used as terms defined by a relative positional relationship based on a laminating order in a multilayer structure. Also, the terms "upper" and "lower" are applied not only to the case in which two components are spaced apart from each other and there is another component between these two components, but also to the case in which two components are arranged to be closely attached to each other and in contact with each other.

First Embodiment

Overall Configuration

Figure 3:
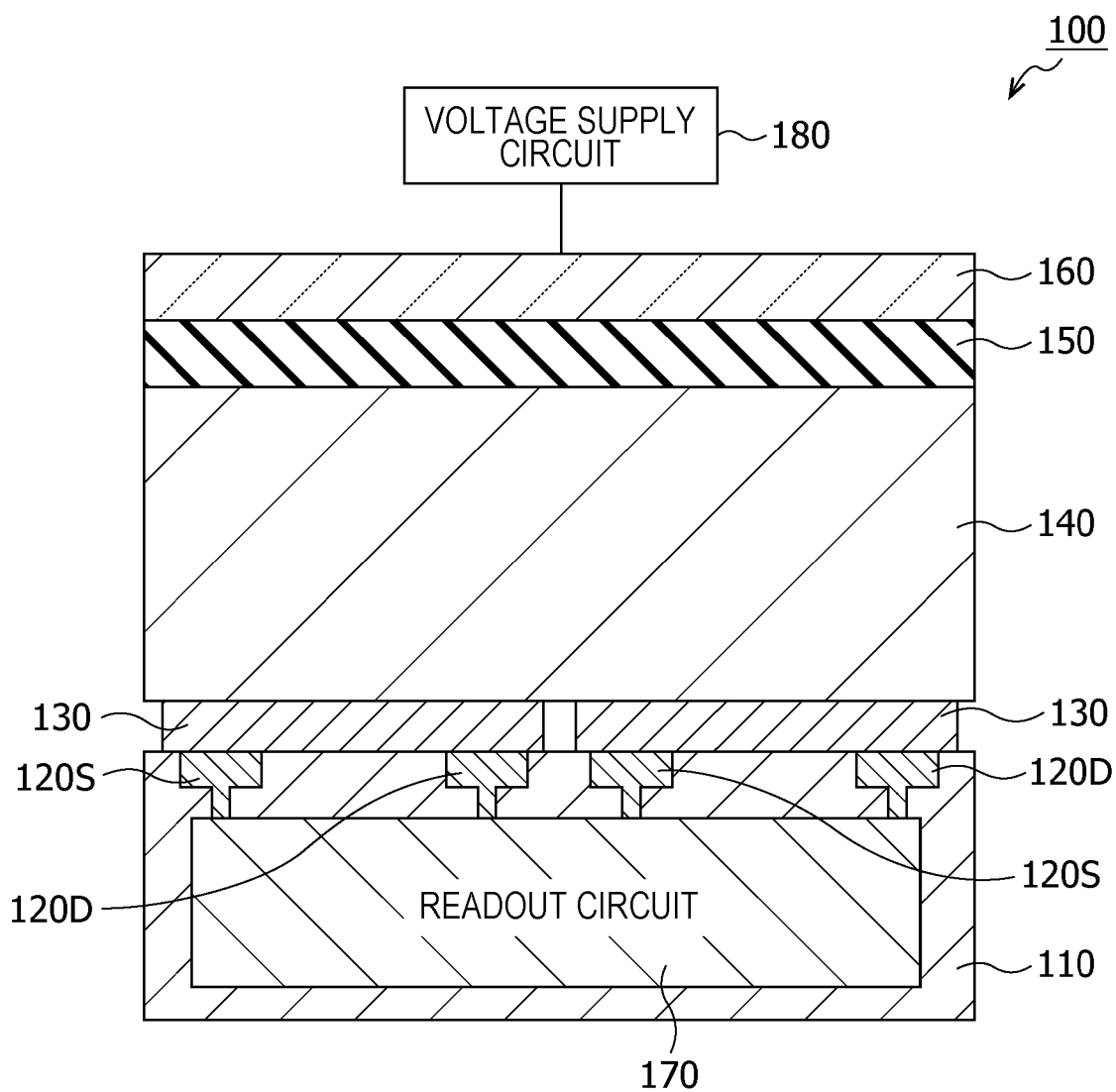
FIG. 3 is a cross-sectional view schematically illustrating the configuration of an optical sensor according to a first embodiment.

FIG. 3 is a cross-sectional view schematically illustrating the configuration of an optical sensor 100 according to a first embodiment. As illustrated in FIG. 3, the optical sensor 100 includes a substrate 110, a source electrode 120S, a drain electrode 120D, a channel layer 130, a photosensitive layer 140, an insulating layer 150, and a counter electrode 160. The optical sensor 100 further includes a readout circuit 170 and a voltage supply circuit 180. On the surface of the substrate 110, the source electrode 120S and the drain electrode 120D are arranged apart from each other. Furthermore, the channel layer 130, the photosensitive layer 140, the insulating layer 150, and the counter electrode 160 are laminated in this order on the source electrode 120S and the drain electrode 120D.

In the example illustrated in FIG. 3, the optical sensor 100 includes two channel layers 130, and two pairs of the source electrode 120S and the drain electrode 120D. In short, one channel layer 130 corresponds to one pixel. That is, the optical sensor 100 illustrated in FIG. 3 includes two pixels. Note that the number of pixels included in the optical sensor 100 may be only one, or three or more. For example, multiple pixels (specifically, multiple channel layers 130) may be arranged in a matrix of n rows and m columns. In short, the optical sensor 100 may be an image sensor that generates a still image or a moving image. Note that n and m are integers greater than or equal to 1. The optical sensor 100 may be a line sensor including multiple pixels arranged on a straight line.

Note that the multiple channel layers 130 are insulated from each other. An insulating material may be filled between two adjacent channel layers 130, or a gap may be provided between two adjacent channel layers 130. Alternatively, part of the photosensitive layer 140 provided on the channel layers 130 may be provided between two adjacent channel layers 130.

Hereinafter, each component of the optical sensor 100 will be described in detail.

Substrate

The substrate 110 is a substrate that supports the channel layer 130, the photosensitive layer 140, the insulating layer 150, and the counter electrode 160. The material of the substrate 110 is not particularly limited, and various materials may be used. The substrate 110 may be, for example, a silicon substrate where the readout circuit 170 is formed.

Source Electrode and Drain Electrode

The source electrode 120S and the drain electrode 120D are provided on the surface of the substrate 110, and are electrically connected to the channel layer 130. Specifically, the source electrode 120S and the drain electrode 120D are provided apart from each other and respectively in contact with two end portions of the channel layer 130. The source electrode 120S and the drain electrode 120D may be in ohmic-contact with the channel layer 130.

The source electrode 120S and the drain electrode 120D may be made of any material as long as the material is capable of forming an electrical contact with the material included in the channel layer 130 so as to transport charge carriers of at least one of electrons and holes. The source electrode 120S and the drain electrode 120D may be formed of the same material or of different materials. For example, the source electrode 120S and the drain electrode 120D are formed using a metal material, or a conductive metal nitride film or the like. Specifically, the source electrode 120S and the drain electrode 120D may be formed of Al, Cu, Ti, TiN, Ta, TaN, Mo, Ru, In, Mg, Ag, Au, Pt, or the like. In addition, to obtain a good electrical contact with the channel layer 130, the surface of the source electrode 120S or the drain electrode 120D may be decorated to form an ultrathin film to adjust the work function of the electrode surface.

Channel Layer

The channel layer 130 is electrically connected with the photosensitive layer 140, and conducts first carriers moving from the photosensitive layer 140 and carriers with the same polarity as the first carriers supplied from the source electrode 120S. In the present embodiment, the first carriers are holes. The electric conductivity of the channel layer 130 greatly fluctuates in response to an electric field in the vertical direction. In addition, the channel layer 130 transports the injected first carriers and carriers that have the same polarity as the first carriers and that are supplied from the source electrode 120S, from the source electrode 120S side toward the drain electrode 120D at high speed. The resistance value of the channel layer 130 in a state where the first carriers are injected from the photosensitive layer 140 is sufficiently smaller than the resistance value immediately before the injection of the first carriers.

The channel layer 130 may include, for example, at least one selected from the group consisting of graphene, phosphorene, transition metal dichalcogenide, hexagonal boron nitride, and organic semiconductor. The channel layer 130 may include, for example, a high-mobility two-dimensional crystal made of these materials.

The channel layer 130 including graphene is formed by, for example, mechanically exfoliating graphite, which is a layered substance. Alternatively, the channel layer 130 including graphene is obtained by growing graphene on the substrate 110 by, for example, chemical vapor deposition (CVD).

Likewise, the channel layer 130 including phosphorene is formed by, for example, thinning black phosphorus. Note that graphene and phosphorene are names used in the case of a single layer; however, in the present specification, these names include the case of having a plurality of layers as long as these layers may be handled as a single layer or a two-dimensional crystal. In the present embodiment, the channel layer 130 only needs to have a sufficient carrier traveling time to gain a desired photoconductive gain. The number of layers of graphene and phosphorene included in the channel layer 130 is not particularly limited as long as the channel layer 130 achieves two-dimensional carrier mobility high enough to obtain a desired photoconductive gain.

Transition metal dichalcogenide is a compound of a transition metal and a chemical element in group 16 of the periodic table excluding oxygen, and its chemical formula is represented as $MX_2$. Here, M is any of W, Mo, Zr, and Hf. X is any of S, Se, and Te. Like graphene, transition metal dichalcogenide is a layered substance, and a two-dimensional high-mobility crystal is obtained by thinning transition metal dichalcogenide.

The channel layer 130 may include an organic semiconductor crystal. Note that the mobility of an organic semiconductor crystal is several orders of magnitude lower than that of graphene, phosphorene, or transition metal dichalcogenide. An organic semiconductor crystal is a solid that has organic molecules arranged on a crystal lattice, but, normally, that strongly maintains the features of one molecule. Therefore, the energy dispersion in the reciprocal lattice space of the crystal is not so great in an organic semiconductor crystal. However, even in the case of an organic semiconductor crystal, high mobility is exhibited when molecules are formed into a crystal lattice in which the overlap of π electron orbits of their molecular skeletons is relatively large. A typical example of such an organic semiconductor crystal is one that has polyacene such as rubrene or pentacene in the skeleton, or one that has heteroacene such as dinaphthothienothiophene (DNTT) or benzothienobenzothiophene (BTBT) in the skeleton. A crystal of such low-molecular-weight organic semiconductor may be formed into a film by vapor deposition. Alternatively, a soluble group may be added to form a film by a wet process such as spin coating or inkjet.

Photosensitive Layer

The photosensitive layer 140 absorbs incident light to generate first carriers with a first polarity and second carriers with a second polarity different from the first polarity. In the present embodiment, the second carriers are electrons. Specifically, the photosensitive layer 140 internally generates electron-hole pairs in response to incident light having a desired wavelength. The photosensitive layer 140 may include a material having an optical energy gap. This allows the photosensitive layer 140 to realize wavelength sensitivity characteristics according to the optical energy gap of the material. In the present embodiment, the photosensitive layer 140 has a trap site that traps the second carriers.

The photosensitive layer 140 includes, for example, quantum dots, carbon nanotubes, organic semiconductor, or amorphous selenium. Specifically, the material used for forming the photosensitive layer 140 includes quantum dots, semiconducting single-walled carbon nanotubes, organic semiconductor materials, and amorphous selenium.

By controlling the particle size, a quantum dot may have a greater optical energy gap than the optical energy gap as a bulk of the material used. The quantum dot includes, for example, at least one selected from the group consisting of CdSe, CdS, PbSe, ZnO, ZnS, CZTS ($Cu_2ZnSnS_4$), $Cu_2S$, $Bi_2S_3$, $Ag_2S$, HgTe, CdHgTe, InAs and InSb. Alternatively, the quantum dot may include, for example, PbS, PbTe, $CuInS_2$, $CuInSe_2$, InP/ZnS, Si, Ge, CdTe, or perovskites. The quantum dot may be a colloidal quantum dot. At least part of the surface of the quantum dot may be oxidized.

In addition, a semiconducting single-walled carbon nanotube may control the optical energy gap by its chirality (helicity). The diameter of a semiconducting single-walled carbon nanotube also changes according to chirality. The optical energy gap decreases as the diameter of a nanotube increases. In the case where the diameter is approximately 0.5 nm or greater, a semiconducting single-walled carbon nanotube has an optical energy gap corresponding to infrared light, which may allow the nanotube to have high sensitivity to infrared light. In addition, because a semiconducting single-walled carbon nanotube has high carrier mobility, the first carriers may be transported to the channel layer at high speed, thereby realizing a sensor having a high response speed.

In addition, organic semiconductor may be an organic semiconductor material generally used as a solar cell or an optical sensor.

The photosensitive layer 140 may be easily formed on the substrate 110 by a wet process such as spin coating or a dry process such as vacuum heating deposition. In addition, the photosensitive layer 140 may be formed of only one type of the above-mentioned materials, or may be formed by mixing or laminating a plurality of types of the above-mentioned materials. For example, the photosensitive layer 140 including both colloidal quantum dots and semiconducting single-walled carbon nanotubes may be formed by mixing and dispersed colloidal quantum dots and semiconducting single-walled carbon nanotubes in an appropriate solvent and performing spin coating. Alternatively, the photosensitive layer 140 with a multilayer structure of colloidal quantum dots and semiconducting single-walled carbon nanotubes may be formed by spin coating colloidal quantum dots and then spin coating semiconductor single-walled carbon nanotubes. Similarly, the photosensitive layer 140 with a multilayer structure of colloidal quantum dots and organic semiconductor may be formed by forming a film of colloidal quantum dots and then forming a film of an organic semiconductor material by vacuum heating deposition.

Insulating Layer

The insulating layer 150 is positioned between the photosensitive layer 140 and the counter electrode 160. The insulating layer 150 includes a material that may electrically insulate the photosensitive layer 140 from the counter electrode 160 and that may transmit light in at least part of a wavelength region to which the photosensitive layer 140 has sensitivity. The insulating layer 150 may include a material that transmits light from the ultraviolet light band to the infrared light band, such as $Al_2O_3$ or $HfO_2$. A transparent oxide film made of $Al_2O_3$, $HfO_2$, or the like is formed by, for example, sputtering or atomic layer deposition (ALD). Alternatively, the insulating layer 150 may include a material that has high transmittance only for light in a specific wavelength range, such as a color resist. In the case where the insulating layer 150 is a color resist, after the color resist is applied on the photosensitive layer 140, the color resist may be exposed to light and developed by performing photolithography, thereby patterning the color resist into a desired shape.

In the case where the photosensitive layer 140 absorbs light in a wide wavelength range from visible light to near infrared light, the insulating layer 150 may include a transparent insulating material such as $Al_2O_3$. At this time, the optical sensor 100 has sensitivity over a wavelength range from visible light to near infrared. The insulating layer 150 may include a color resist that blocks visible light and that has high transmittance only for near infrared light. At this time, the optical sensor 100 is sensitive only to near infrared light. In this manner, by using a color resist as the insulating layer 150, the sensitivity of the optical sensor 100 may be limited to a specific wavelength range. The insulating layer 150 may include a color resist with a different transmission band for each pixel. For example, the insulating layer 150 may include three types of, namely, RGB, color resists for each pixel. At this time, the optical sensor 100 may be used as an image sensor that generates a color image. In addition, in the case where the photosensitive layer 140 includes organic semiconductor with low stability against ultraviolet light, the insulating layer 150 may include a color resist that blocks ultraviolet light. This enhances the durability of the optical sensor 100.

Counter Electrode

The counter electrode 160 faces the channel layer 130 with the photosensitive layer 140 and the insulating layer 150 interposed therebetween. Specifically, the counter electrode 160 is provided on the insulating layer 150.

The counter electrode 160 is translucent to light with a desired wavelength used for imaging. For example, the counter electrode 160 includes a material transparent to at least one of visible light, infrared light, and ultraviolet light. Specifically, the counter electrode 160 may include a transparent metal oxide film such as ITO, F-doped Tin Oxide (FTO), Al-doped Zinc Oxide (AZO), Ga-doped Zinc Oxide (GZO), or ZnO, graphene, metal nanowire, or the like. The counter electrode 160 has a transmittance of 10% or greater for a wavelength absorbed by the photosensitive layer 140. Alternatively, the transmittance of the counter electrode 160 for a wavelength absorbed by the photosensitive layer 140 may be greater than or equal to 50%, or may be greater than or equal to 80%.

Readout Circuit

The readout circuit 170 reads out the amount of change in signal charge that travels through the channel layer 130 and that is swept out to the drain electrode 120D, that is, the amount of change in current flowing through the drain electrode 120D. Accordingly, an output signal corresponding to the amount of light incident on the optical sensor 100 is generated and output. In the case where the optical sensor 100 includes a plurality of pixels, the readout circuit 170 reads, for each pixel, the amount of change in current flowing through the drain electrode 120D. In short, the readout circuit 170 generates, for each pixel, an output signal according to the amount of light and outputs it as image data.

The readout circuit 170 includes, for example, a sample hold circuit, a selector circuit that selects a pixel, a pixel column, or a pixel row, a correlated double sampling (CDS) circuit, and an amplifier circuit. The specific configuration of the readout circuit 170 is described in, for example, Japanese Unexamined Patent Application Publication No. 2017-28682, U.S. Pat. No. 10,070,083, Japanese Unexamined Patent Application Publication No. 2017-79462, or U.S. Pat. No. 9,955,100. All the disclosures of Japanese Unexamined Patent Application Publication No. 2017-28682, U.S. Pat. No. 10,070,083, Japanese Unexamined Patent Application Publication No. 2017-79462, and U.S. Pat. No. 9,955,100 are incorporated herein by reference. Note that the readout circuit 170 may have any configuration as long as it may detect a change in current flowing through the drain electrode 120D.

Although the readout circuit 170 is provided inside the substrate 110, the place where the readout circuit 170 is provided is not limited to this. At least part of the readout circuit 170 may be provided outside the substrate 110 or on the surface of the substrate 110 in a peripheral region different from a pixel region. Note that the pixel region is a region where each channel layer 130 is provided in plan view. At least part of the readout circuit 170 includes one or more circuit elements or an electronic circuit such as an integrated circuit (IC).

Voltage Supply Circuit

The voltage supply circuit 180 supplies a first voltage and a second voltage different from the first voltage to the counter electrode 160. The voltage supply circuit 180 supplies voltage to the counter electrode 160 to generate an electric field in the photosensitive layer 140. Specifically, the voltage supply circuit 180 supplies different voltages to the counter electrode 160 when the optical sensor 100 is exposed to light and when the optical sensor 100 is reset. Accordingly, the direction of an electric field generated in the photosensitive layer 140 may be changed between exposure to light and reset.

Although the voltage supply circuit 180 is schematically illustrated in FIG. 3, the voltage supply circuit 180 is provided, for example, inside the substrate 110. Alternatively, at least part of the voltage supply circuit 180 may be provided outside the substrate 110 or on the surface of the substrate 110 in the peripheral region. At least part of the voltage supply circuit 180 includes one or more circuit elements or an electronic circuit such as an IC.

Operation and Effects

The optical sensor 100 according to the present embodiment performs an operation of exposing the photosensitive layer 140 to light and reading signal charge from the drain electrode 120D, and an operation of resetting the photosensitive layer 140 and the channel layer 130 after reading the signal charge. For example, in the case where the optical sensor 100 generates a video image, exposure to light and reset are repeatedly performed.

Figure 4A:
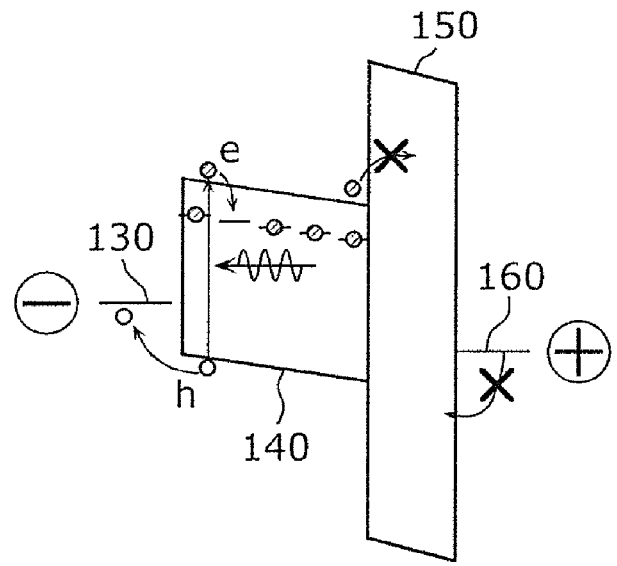
FIG. 4A illustrates an energy diagram of the optical sensor according to the first embodiment upon exposure to light.

FIG. 4A illustrates an energy diagram of the optical sensor 100 according to the present embodiment upon exposure to light. Using FIG. 4A, the mechanism of the light exposure operation will be described. To simplify the description, the case in which the first carriers traveling through the channel layer 130 are holes will be described here. Note that the configuration of the present disclosure is also applicable to the case in which the first carriers traveling through the channel layer 130 are electrons. An example in the case where the first carriers are electrons will be described later using FIGS. 8A and 8B.

As illustrated in FIG. 4A, the insulating layer 150 is provided between the photosensitive layer 140 and the counter electrode 160. Among electron-hole pairs generated in the photosensitive layer 140 upon light incidence, the holes travel through the valence band of the photosensitive layer 140 and move to the channel layer 130.

At this time, the voltage supply circuit 180 applies the first voltage across the counter electrode 160 and the channel layer 130 so that the potential of the counter electrode 160 will be positive with reference to the potential of the channel layer 130. This may promote the holes to move from the photosensitive layer 140 to the channel layer 130. Note that the voltage supply circuit 180 need not apply the first voltage upon exposure to light.

Electrons generated in the photosensitive layer 140 are trapped in trap sites in the photosensitive layer 140 or travel through the conduction band and accumulate at the interface with the insulating layer 150. In other words, the provision of the insulating layer 150 suppresses the movement of electrons from the photosensitive layer 140 to the counter electrode 160, regardless of the presence of trap sites. Accordingly, the life of electrons trapped in the photosensitive layer 140 may be extended. Therefore, since the life u becomes greater, a high photoconductive gain may be obtained on the basis of Formula (1). In this manner, since the optical sensor 100 includes the insulating layer 150, a high photoconductive gain may be obtained even when the photosensitive layer 140 has no trap sites.

In the case where the photosensitive layer 140 has trap sites, it becomes more difficult for electrons trapped in the trap sites to move freely. Therefore, the probability of contact and recombination with holes among electron-hole pairs generated in the photosensitive layer 140 is reduced, and the life of electrons trapped in the photosensitive layer 140 is further extended. Therefore, since the photosensitive layer 140 has trap sites, the photoconductive gain may be improved.

Upon exposure to light, the first voltage is applied to the counter electrode 160, and an electric field directed from the counter electrode 160 toward the channel layer 130 is applied to the interior of the photosensitive layer 140. Also in this case, the provision of the insulating layer 150 suppresses the injection of holes from the counter electrode 160 into the photosensitive layer 140. Therefore, holes supplied from the photosensitive layer 140 to the channel layer 130 are limited to holes generated by light incident on the photosensitive layer 140. That is, holes that are not caused by light that is incident upon exposure to light are prevented from being supplied to the channel layer 130.

If holes are injected from the counter electrode 160 into the photosensitive layer 140, among electron-hole pairs generated as a result of light incidence, there is a possibility that electrons trapped in the photosensitive layer 140 recombine with the injected holes and disappear. When such recombination occurs, the life of electrons trapped in the photosensitive layer 140 is shortened and the photoconductive gain is reduced. In contrast, in the case where the optical sensor 100 includes the insulating layer 150, the probability of such recombination may be reduced, thereby improving the photoconductive gain.

Figure 4B:
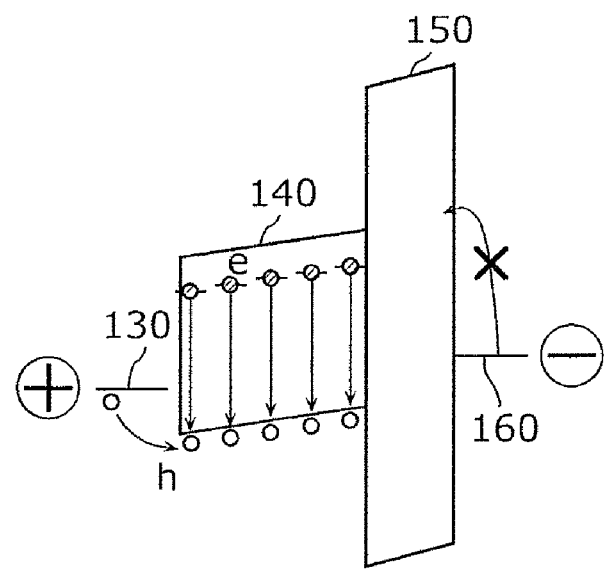
FIG. 4B illustrates an energy diagram of the optical sensor according to the first embodiment upon reset.

FIG. 4B illustrates an energy diagram of the optical sensor 100 according to the present embodiment upon reset. Using FIG. 4B, the mechanism of the reset operation will be described. Also in the example illustrated in FIG. 4B, the first carriers traveling through the channel layer 130 are holes.

As illustrated in FIG. 4B, upon reset, in contrast to upon exposure to light, the voltage supply circuit 180 applies the second voltage across the counter electrode 160 and the channel layer 130 so that the potential of the counter electrode 160 will be negative with reference to the potential of the channel layer 130. Accordingly, an electric field in the direction from the channel layer 130 to the counter electrode 160 is generated in the photosensitive layer 140. Due to this electric field, holes are injected from the channel layer 130 into the photosensitive layer 140. The holes injected into the photosensitive layer 140 recombine with electrons trapped in the photosensitive layer 140 to allow the electrons to disappear.

Since the insulating layer 150 is provided between the counter electrode 160 and the photosensitive layer 140, the injection of electrons from the counter electrode 160 into the photosensitive layer 140 may be suppressed. Therefore, after reset, new electrons may be prevented from being trapped in the photosensitive layer 140. In this manner, electrons in the photosensitive layer 140 after reset may be sufficiently reduced, and appropriate reset may be performed. Since reset may be performed quickly by injecting holes from the channel layer 130 into the photosensitive layer 140, the time required for reset may be reduced. Therefore, the response speed of the optical sensor 100 may be increased.

As described above, according to the optical sensor 100 according to the present embodiment, the provision of the insulating layer 150 between the counter electrode 160 and the photosensitive layer 140 may reduce noise. This may also improve the photoconductive gain, increase the efficiency of the reset operation, and increase the response speed.

Second Embodiment

Next, an optical sensor according to a second embodiment will be described. Hereinafter, differences from the first embodiment will be mainly described, and descriptions of common points will be omitted or simplified.

Overall Configuration

Figure 5:
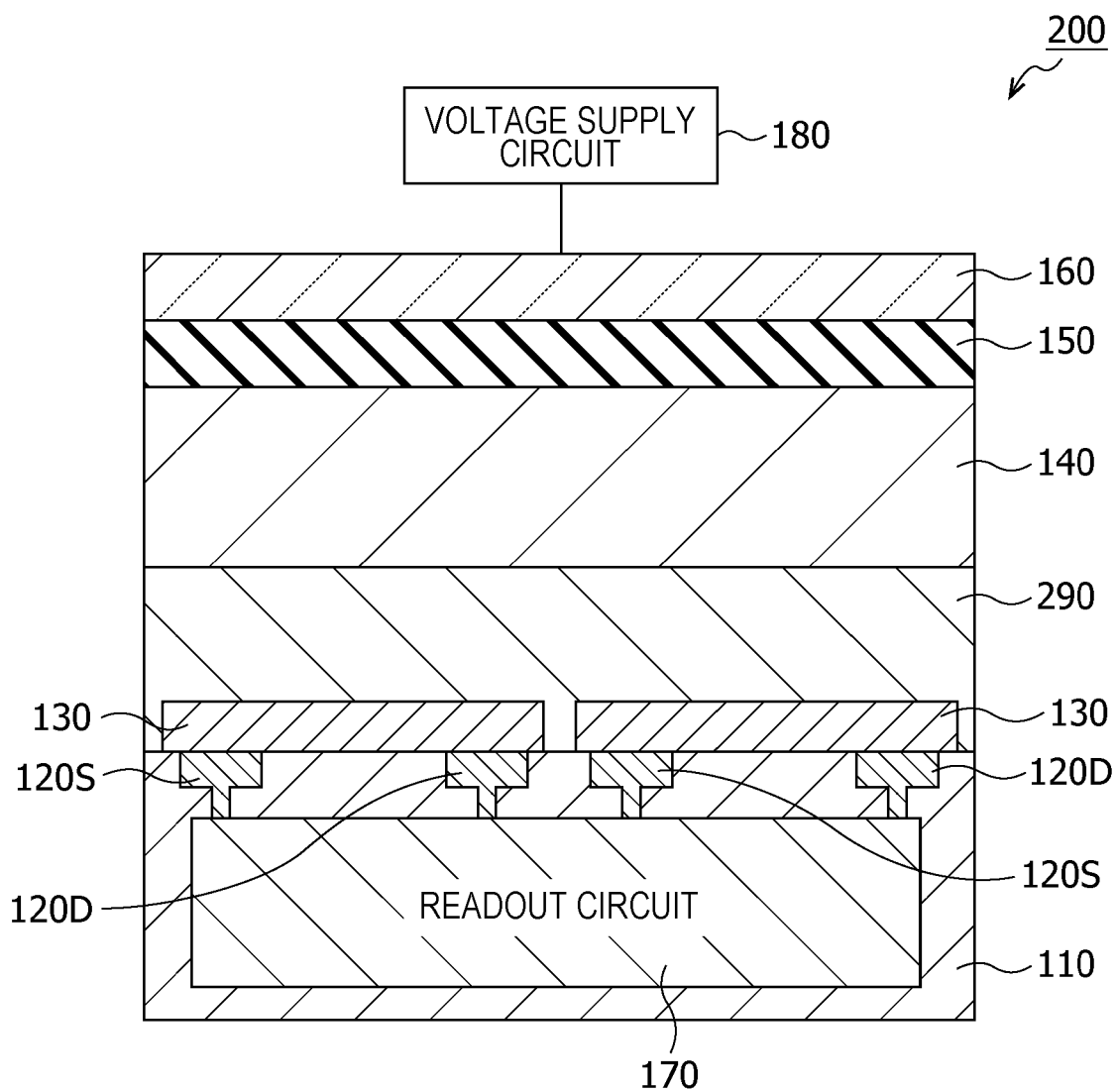
FIG. 5 is a cross-sectional view schematically illustrating the configuration of an optical sensor according to a second embodiment.

FIG. 5 is a cross-sectional view schematically illustrating the configuration of an optical sensor 200 according to the present embodiment. As illustrated in FIG. 5, the optical sensor 200 is different from the optical sensor 100 according to the first embodiment in the point that the optical sensor 200 newly includes a carrier selecting layer 290. On the surface of the substrate 110, the source electrode 120S and the drain electrode 120D are arranged apart from each other. Furthermore, the channel layer 130, the carrier selecting layer 290, the photosensitive layer 140, the insulating layer 150, and the counter electrode 160 are laminated in this order on the source electrode 120S and the drain electrode 120D.

Carrier Selecting Layer

The carrier selecting layer 290 is a layer that is positioned between the channel layer 130 and the photosensitive layer 140, and that suppresses the movement of the second carriers from the channel layer 130 to the photosensitive layer 140. The second carriers are carriers whose polarity is opposite to that of the first carriers injected from the photosensitive layer 140 into the channel layer 130, and the second carriers are electrons in the present embodiment. Specifically, the carrier selecting layer 290 transports, among electron-hole pairs generated in the photosensitive layer 140, only one type of the carriers from the photosensitive layer 140 to the channel layer 130, and suppresses the transport of the other type of carriers.

Figure 6A:
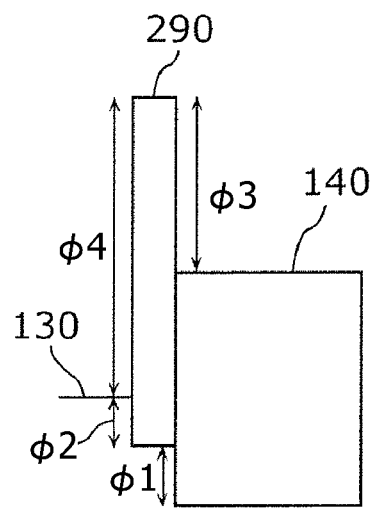
FIG. 6A is a diagram illustrating an example of an energy diagram of the optical sensor according to the second embodiment.
Figure 6B:
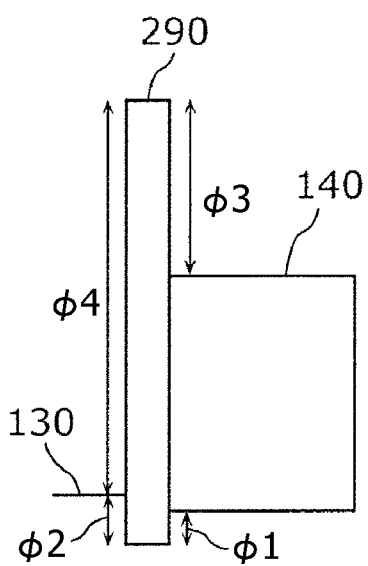
FIG. 6B is a diagram illustrating another example of the energy diagram of the optical sensor according to the second embodiment.

For example, in the case where carriers traveling through the channel layer 130 are holes, the carrier selecting layer 290 is made of a material that forms an energy diagram as illustrated in FIG. 6A or 6B. FIGS. 6A and 6B each illustrate an exemplary energy diagram of the optical sensor 200 according to the present embodiment.

Specifically, the carrier selecting layer 290 is made of a material that has a hole transport level equivalent to the hole transport level of the photosensitive layer 140 and the hole transport level of the channel layer 130, and that has an electron transport level lower than the electron transport level of the photosensitive layer 140 and the electron transport level of the channel layer 130.

The hole transport level of the carrier selecting layer 290 is, for example, positioned between the hole transport level of the channel layer 130 and the hole transport level of the photosensitive layer 140, as illustrated in FIG. 6A. Alternatively the hole transport level of the carrier selecting layer 290 may be positioned to be higher than the hole transport level of each of the channel layer 130 and the photosensitive layer 140, as illustrated in FIG. 6B.

Here, the hole transport level means the valence band maximum (VBM), and, in the case of an organic substance, it may be regarded as synonymous with the highest occupied molecular orbital (HOMO). The electron transport level means the conduction band minimum (CBM), and, in the case of an organic substance, it may be synonymous with the lowest unoccupied molecular orbital (LUMO). In general, the energy level of the valence band upper end or HOMO, which is the hole transport level, may be measured using ultraviolet photoelectron spectroscopy or the like. In addition, the energy level of the conduction band lower end or LUMO, which is the electron transport level, may be measured using inverse photoelectron spectroscopy or the like.

In the case of the carrier selecting layer 290 illustrated in FIG. 6A, the energy barrier of holes transported between the photosensitive layer 140 and the channel layer 130 is determined by the sum of $\phi 1$ and $\phi 2$. In the case of the carrier selecting layer 290 illustrated in FIG. 6B, the energy barrier is determined by $\phi 1$ or $\phi 2$. Therefore, the smaller the value of each energy barrier, the more efficiently the holes are transported. For example, $\phi 1$ and $\phi 2$ are less than or equal to 1 eV.

Also in the case of the carrier selecting layer 290 illustrated in any of FIGS. 6A and 6B, the energy barrier of electrons transported between the photosensitive layer 140 and the channel layer 130 is determined by $\phi 3$ or $\phi 4$. Therefore, the greater the value of each energy barrier, the higher the effect of suppressing the movement of electrons. For example, $\phi 3$ and $\phi 4$ are greater than or equal to 1 eV. $\phi 3$ and $\phi 4$ are greater than, for example, $\phi 1$ and $\phi 2$, respectively. For example, $\phi 3$ and $\phi 4$ are values that are at least twice as great as $\phi 1$ or $\phi 2$. Note that $\phi 1$, $\phi 2$, $\phi 3$, and $\phi 4$ each mean the absolute value of the value of a corresponding energy barrier.

As described above, whether the carrier selecting layer 290 selectively transports electrons or holes is determined on the basis of the size of an energy barrier formed between the channel layer 130 and the photosensitive layer 140 that are adjacent to each other. Therefore, the material used for the carrier selecting layer 290 may be appropriately selected in accordance with the materials used for the channel layer 130 and the photosensitive layer 140. For example, a material in which both VBM (HOMO) and CBM (LUMO) are shallow with respect to the vacuum level may be used to function as a hole selecting layer that blocks electrons and transports holes, as illustrated in FIGS. 6A and 6B. In contrast, a material in which both VBM (HOMO) and CBM (LUMO) are deep with respect to the vacuum level may be used to function as an electron selecting layer that blocks holes and transports electrons. The material of the carrier selecting layer 290 for allowing it to function as a hole selecting layer includes, for example, metal oxides such as NiO, $Co_3O_4$, CoO, $Cr_2O_3$, CuO, and $Cu_2O$, and hole-transporting organic semiconductor such as α-NPD (4,4'-bis[N-(1-naphthyl)-N-phenylamino]biphenyl), TAPC (1,1-bis[(di-4-tolylamino)phenyl]cyclohexane), MTDATA (4,4', 4"-tris(N-3-methylphenyl-N-phenylamino)triphenylamine). The material of the carrier selecting layer 290 for allowing it to function as an electron selecting layer includes, for example, metal oxides such as $MoO_3$, $CrO_3$, $V_2O_5$, $WO_3$, $Ag_2O$, $Ta_2O_5$, $TiO_2$, $ZrO_2$, and ZnO, and electron-transporting organic semiconductor such as Alq3 ((8-hydroxyquinolinato)aluminum), C60 (fullerene), PCBM (phenyl C61 methyl butyrate ester), BCP (bathocuproine), F16-CuPc (hexadecafluorocopper phthalocyanine), and PTCDA (perylenetetracarboxylic dianhydride).

A film made of a metal oxide may be formed by sputtering, ALD, or the like. Alternatively, a film made of a metal oxide may be formed by applying spin coating, inkjet, or the like to ink in which nanoparticles are dispersed in a solvent. A film made of an organic semiconductor material may be formed by dry film formation with the use of vacuum heating deposition. Alternatively, an organic semiconductor material may be dissolved in an appropriate solvent, which is then subjected to wet film formation such as spin coating, inkjet, or spray coating to form a film.

Operation and Effects

Like the optical sensor 100 according to the first embodiment, the optical sensor 200 according to the present embodiment performs a light exposure operation and a reset operation.

Figure 7A:
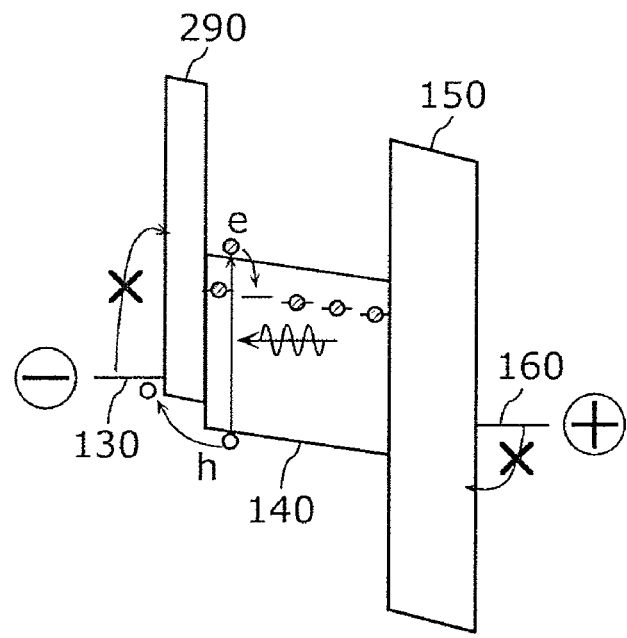
FIG. 7A illustrates an energy diagram of the optical sensor according to the second embodiment upon exposure to light.

FIG. 7A illustrates an energy diagram of the optical sensor 200 according to the present embodiment upon exposure to light. Using FIG. 7A, the mechanism of the light exposure operation will be described. To simplify the description likewise, the case in which the first carriers traveling through the channel layer 130 are holes will be described here.

As illustrated in FIG. 7A, in the optical sensor 200 according to the present embodiment, in addition to the configuration of the first embodiment, the carrier selecting layer 290 functioning as a hole selecting layer is further provided between the photosensitive layer 140 and the channel layer 130. The carrier selecting layer 290 satisfies the following conditions as physical properties in order to efficiently transport holes from the photosensitive layer 140 to the channel layer 130 and to reduce noise in the dark.

Specifically, the ionization energy of a material used for the carrier selecting layer 290 may be the same as or less than the ionization energy of the photosensitive layer 140. Accordingly, holes among electron-hole pairs generated in the photosensitive layer 140 upon light incidence are transported from the valence band of the photosensitive layer 140 to the channel layer 130 via the valence band of the carrier selecting layer 290.

At this time, the voltage supply circuit 180 applies the first voltage across the counter electrode 160 and the channel layer 130 so that the potential of the counter electrode 160 will be positive with reference to the potential of the channel layer 130. This may promote the transport of holes.

By physically separating the photosensitive layer 140 where electrons are trapped and the channel layer 130 where holes are traveling, the recombination of electrons trapped in the photosensitive layer 140 with holes traveling through the channel layer 130 may be suppressed. Accordingly, the life of electrons may be extended, thereby improving the photoconductive gain.

In addition, the electron affinity of a material used for the carrier selecting layer 290 may be less than the electron affinity of the photosensitive layer 140. Accordingly, as illustrated in FIG. 7A, the injection of electrons from the channel layer 130 into the photosensitive layer 140 may be suppressed. This may suppress the occurrence of an unintended multiplication phenomenon due to the injection of electrons in the dark, thereby reducing noise.

In this manner, since the optical sensor 200 includes the carrier selecting layer 290, the photoconductive gain may be improved, and noise in the dark may be reduced.

Figure 7B:
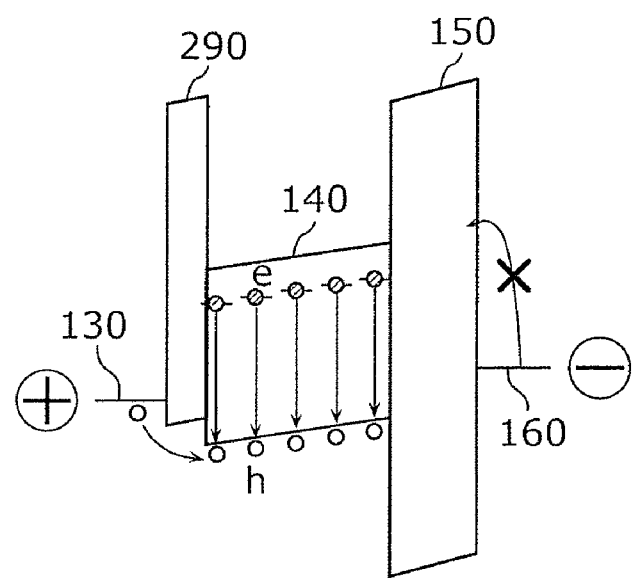
FIG. 7B illustrates an energy diagram of the optical sensor according to the second embodiment upon reset.

FIG. 7B illustrates an energy diagram of the optical sensor 200 according to the present embodiment upon reset. Using FIG. 7B, the mechanism of the reset operation will be described. Also in the example illustrated in FIG. 7B, the first carriers traveling through the channel layer 130 are holes.

As illustrated in FIG. 7B, upon reset, in contrast to upon exposure to light, the voltage supply circuit 180 applies the second voltage across the counter electrode 160 and the channel layer 130 so that the potential of the counter electrode 160 will be negative with reference to the potential of the channel layer 130. Accordingly, an electric field in the direction from the channel layer 130 to the counter electrode 160 is generated in the photosensitive layer 140, and, due to this electric field, holes are injected from the channel layer 130 into the photosensitive layer 140 via the carrier selecting layer 290. At this time, since the carrier selecting layer 290 is configured so as not to hinder the transport of holes, holes are effectively injected from the channel layer 130 into the photosensitive layer 140. The holes injected into the photosensitive layer 140 recombine with electrons trapped in the photosensitive layer 140, thereby allowing the electrons to disappear. Accordingly, the time required for reset may be shortened, and the response speed of the optical sensor 200 may be increased.

Note that the point in the present embodiment that the injection of electrons and holes from the counter electrode 160 is suppressed since the insulating layer 150 is provided between the photosensitive layer 140 and the counter electrode 160 is the same as the first embodiment.

As described above, according to the optical sensor 200 according to the present embodiment, the provision of the carrier selecting layer 290 between the photosensitive layer 140 and the channel layer 130 may reduce noise and improve the photoconductive gain.

Modifications

Here, as a modification of the second embodiment, the case in which the first carriers traveling through the channel layer 130 are electrons will be described. In this case, as illustrated in FIGS. 8A and 8B, the optical sensor 200 includes a carrier selecting layer 291 that functions as an electron selecting layer, instead of the carrier selecting layer 290 functioning as a hole selecting layer.

Figure 8A:
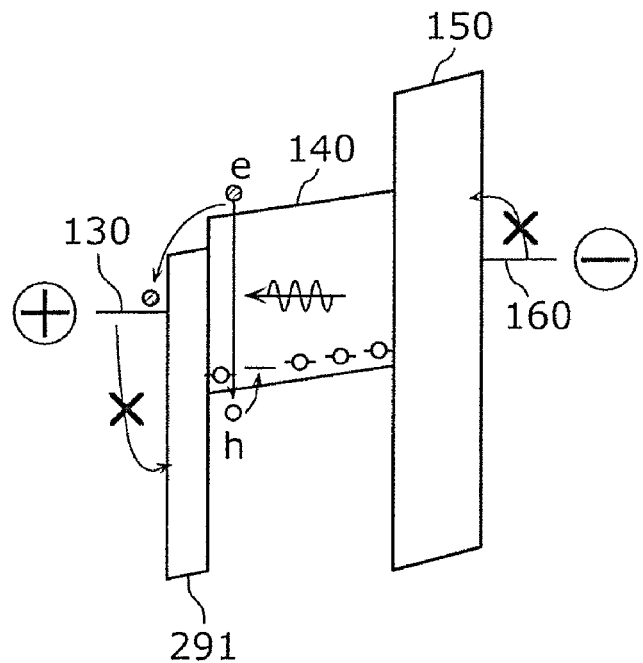
FIG. 8A illustrates an energy diagram when an optical sensor according to a modification of the second embodiment upon exposure to light.
Figure 8B:
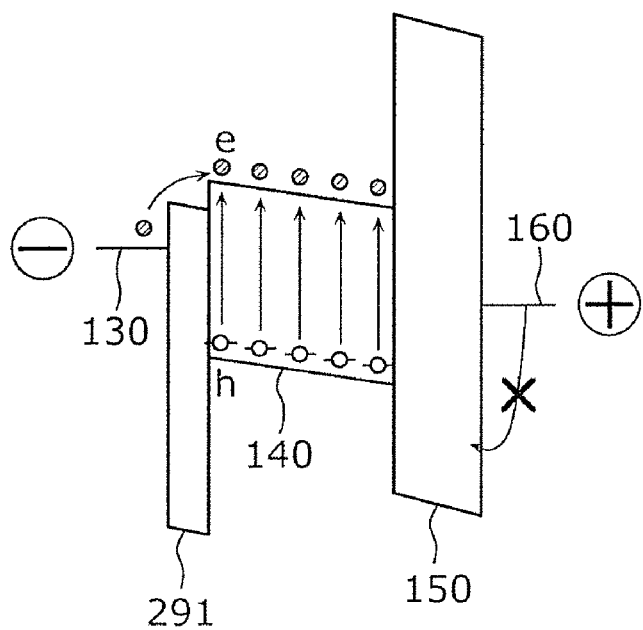
FIG. 8B illustrates an energy diagram of the optical sensor according to the modification of the second embodiment upon reset.

FIG. 8A illustrates an energy diagram of the optical sensor 200 according to the modification of the present embodiment upon exposure to light. Here, the first carriers traveling through the channel layer 130 are electrons. The second carriers trapped in the photosensitive layer 140 are holes.

As illustrated in FIG. 8A, in the optical sensor 200 according to the present modification, the carrier selecting layer 291 functioning as an electron selecting layer is provided between the photosensitive layer 140 and the channel layer 130. The carrier selecting layer 291 satisfies the following conditions as physical properties in order to efficiently transport electrons from the photosensitive layer 140 to the channel layer 130 and to reduce noise in the dark.

Specifically, the carrier selecting layer 291 is made of a material that has an electron transport level equivalent to the electron transport level of the photosensitive layer 140 and the electron transport level of the channel layer 130, and that has a hole transport level higher than the hole transport level of the photosensitive layer 140 and the hole transport level of the channel layer 130. The electron transport level of the carrier selecting layer 291 is, for example, positioned between the electron transport level of the channel layer 130 and the electron transport level of the photosensitive layer 140, as illustrated in FIG. 8A. Alternatively, the electron transport level of the carrier selecting layer 291 may be positioned at a position lower than the electron transport level of each of the channel layer 130 and the photosensitive layer 140.

For example, the electron affinity of a material used for the carrier selecting layer 291 may be equal to or greater than the electron affinity of the photosensitive layer 140. Accordingly, as illustrated in FIG. 8A, electrons among electron-hole pairs generated in the photosensitive layer 140 upon light incidence are transported from the valence band of the photosensitive layer 140 to the channel layer 130 via the valence band of the carrier selecting layer 291.

At this time, the voltage supply circuit 180 applies the second voltage across the counter electrode 160 and the channel layer 130 so that the potential of the counter electrode 160 will be negative with reference to the potential of the channel layer 130. Since the polarity of carriers traveling through the channel layer 130 is opposite to that in the case of the second embodiment, the voltage supply circuit 180 applies voltage to the counter electrode 160 so that the direction of an electric field generated in the photosensitive layer 140 will also be opposite. This may promote the movement of electrons from the photosensitive layer 140 to the channel layer 130.

In this modification, holes are trapped in the photosensitive layer 140. By physically separating the photosensitive layer 140 where holes are trapped and the channel layer 130 where electrons are traveling, the recombination of holes trapped in the photosensitive layer 140 with electrons traveling through the channel layer 130 may be suppressed. Accordingly, the life of holes may be extended, thereby improving the photoconductive gain, as in the second embodiment.

In addition, the ionization energy of a material used for the carrier selecting layer 291 is greater than the ionization energy of the photosensitive layer 140. Therefore, the injection of holes from the channel layer 130 into the photosensitive layer 140 may be suppressed in the dark. Since the occurrence of an unintended multiplication phenomenon due to injection of holes in the dark is suppressed, noise may be reduced.

FIG. 8B illustrates an energy diagram of the optical sensor 200 according to the modification of the present embodiment upon reset. Also in the example illustrated in FIG. 8B, the first carriers traveling through the channel layer 130 are electrons.

As illustrated in FIG. 8B, upon reset, in contrast to upon exposure to light, the voltage supply circuit 180 applies the first voltage across the counter electrode 160 and the channel layer 130 so that the potential of the counter electrode 160 will be positive with reference to the potential of the channel layer 130. Accordingly, an electric field in the direction from the counter electrode 160 to the channel layer 130 is generated in the photosensitive layer 140, and, due to this electric field, electrons are injected from the channel layer 130 into the photosensitive layer 140 via the carrier selecting layer 291. At this time, since the carrier selecting layer 291 is configured so as not to hinder the transport of electrons, electrons are effectively injected from the channel layer 130 into the photosensitive layer 140. The electrons injected into the photosensitive layer 140 recombine with holes trapped in the photosensitive layer 140, thereby allowing the holes to disappear. Accordingly, the time required for reset may be shortened, and the response speed of the optical sensor 200 may be increased.

Since the insulating layer 150 is provided between the counter electrode 160 and the photosensitive layer 140, as illustrated in FIG. 8A, the injection of electrons from the counter electrode 160 into the photosensitive layer 140 may be suppressed upon exposure to light. This may suppress the recombination of electrons injected into the photosensitive layer 140 with holes trapped in the photosensitive layer 140. Therefore, the life of holes may be extended, thereby improving the photoconductive gain of the optical sensor 200.

In addition, as illustrated in FIG. 8B, the insulating layer 150 suppresses the injection of holes from the counter electrode 160 into the photosensitive layer 140 upon reset. Accordingly, holes remaining in the photosensitive layer 140 after the reset may be sufficiently reduced, and appropriate reset may be performed.

As described above, in the optical sensor 200 according to the present modification, as in the second embodiment, noise may be reduced, and the photoconductive gain may be improved.

Third Embodiment

Next, an optical sensor according to a third embodiment will be described. Hereinafter, differences from the second embodiment will be mainly described, and descriptions of common points will be omitted or simplified.

Figure 9:
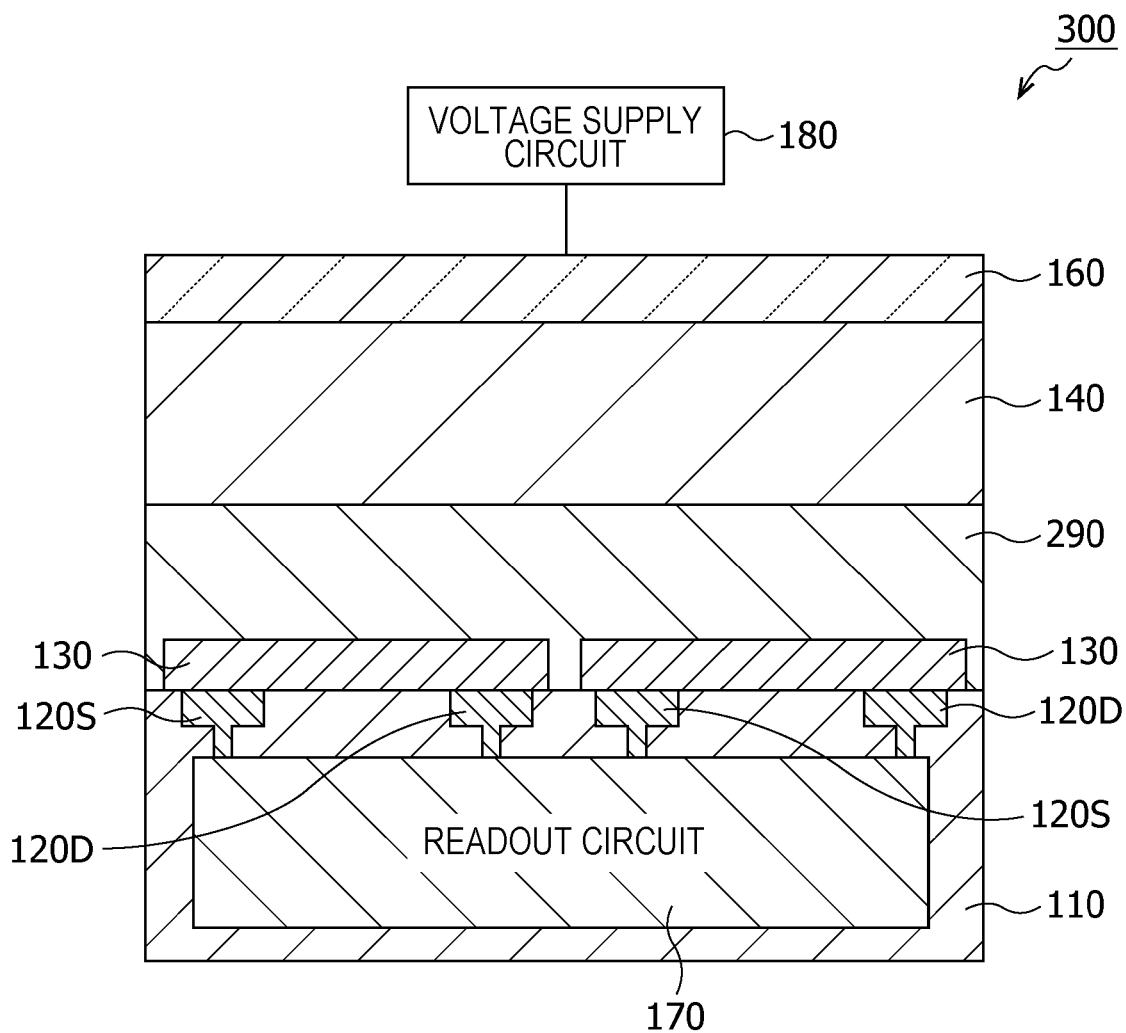
FIG. 9 is a cross-sectional view schematically illustrating the configuration of an optical sensor according to a third embodiment.

FIG. 9 is a cross-sectional view schematically illustrating the configuration of an optical sensor 300 according to the present embodiment. As illustrated in FIG. 9, the optical sensor 300 is different from the optical sensor 200 according to the second embodiment in the point that the optical sensor 300 does not include the insulating layer 150. On the surface of the substrate 110, the source electrode 120S and the drain electrode 120D are arranged apart from each other. Furthermore, the channel layer 130, the carrier selecting layer 290, the photosensitive layer 140, and the counter electrode 160 are laminated in this order on the source electrode 120S and the drain electrode 120D.

According to the present embodiment, as in the second embodiment, since the optical sensor 300 includes the carrier selecting layer 290, the injection of electrons or holes from the channel layer 130 into the photosensitive layer 140 is suppressed. Therefore, the optical sensor 300 may reduce noise.

In addition, upon exposure to light, the carrier selecting layer 290 suppresses the recombination of holes or electrons traveling through the channel layer 130 and electrons or holes trapped in the photosensitive layer 140. Therefore, because the life of electrons or holes trapped in the photosensitive layer 140 is extended, the photoconductive gain of the optical sensor 300 may be improved.

Fourth Embodiment

Next, an optical sensor according to a fourth embodiment will be described. Hereinafter, differences from the second embodiment will be mainly described, and descriptions of common points will be omitted or simplified.

Figure 10:
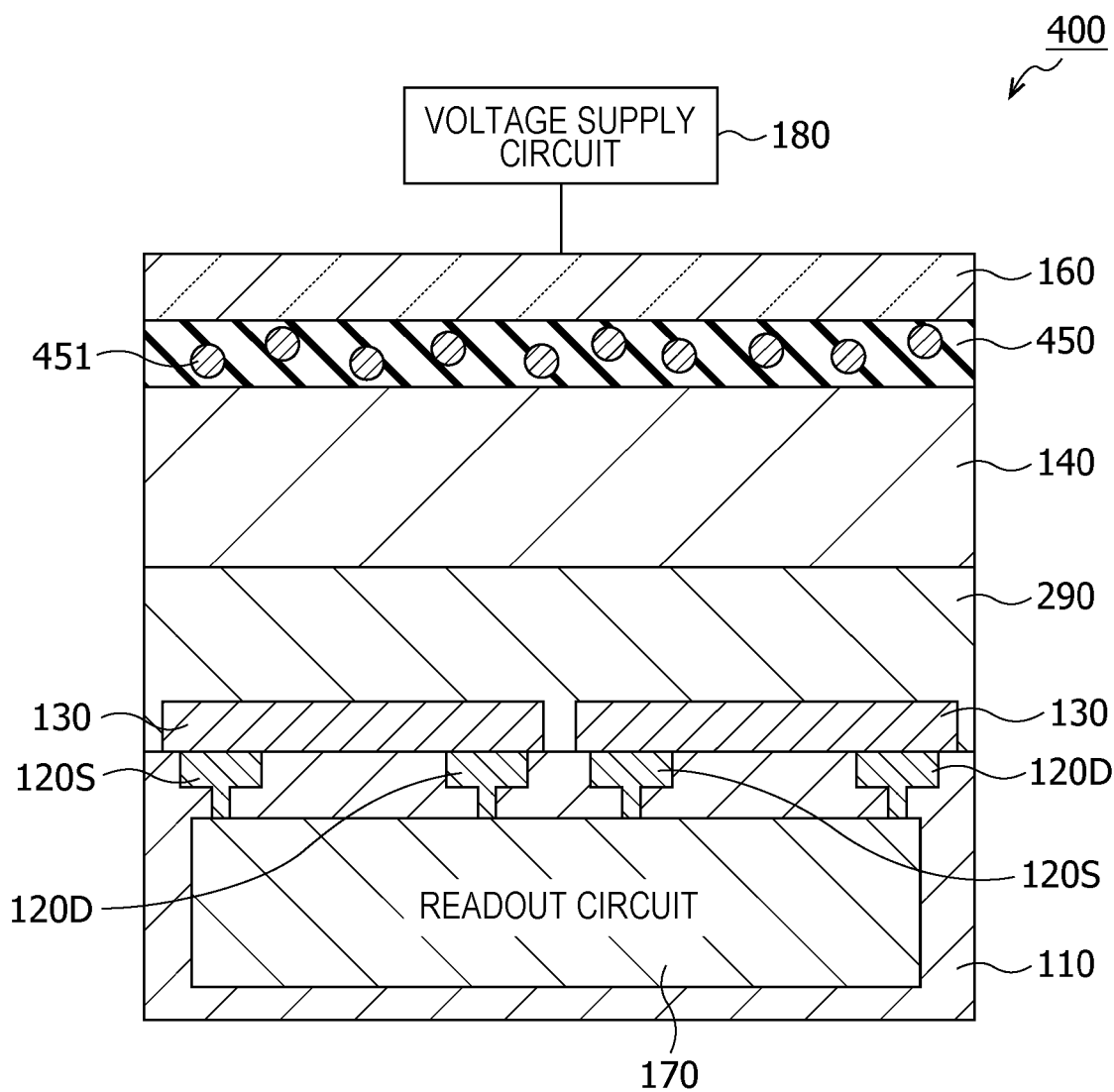
FIG. 10 is a cross-sectional view schematically illustrating the configuration of an optical sensor according to a fourth embodiment.

FIG. 10 is a cross-sectional view schematically illustrating the configuration of an optical sensor 400 according to the present embodiment. As illustrated in FIG. 10, the optical sensor 400 is different from the optical sensor 200 according to the second embodiment in the point that the optical sensor 400 includes an insulating layer 450 instead of the insulating layer 150.

The insulating layer 450 includes a pigment 451, which absorbs light in a certain wavelength band. Accordingly, the insulating layer 450 may remove light in the wavelength band absorbed by the pigment 451 from the incident light. In short, the insulating layer 450 has a filter function with wavelength selectivity. The pigment 451 is, for example, a pigment or a dye.

Of the wavelength range absorbed by the photosensitive layer 140, the transmittance of the insulating layer 450 for light in a selected wavelength range is, for example, 10% or greater. Of the wavelength range absorbed by the photosensitive layer 140, the transmittance of the insulating layer 450 for light outside the selected wavelength range is, for example, less than 10%. The insulating layer 450 may have a transmittance of 10% or greater for light in a certain wavelength range, and a transmittance of less than 10% for light in another wavelength range. Here, the certain wavelength range may be at least part of a wavelength range where the insulating layer 450 has absorption, and another wavelength range may be at least part of a wavelength range where the insulating layer 450 does not have absorption. Accordingly, the optical sensor 400 with sensitivity in a narrow wavelength range may be realized.

Figure 11:
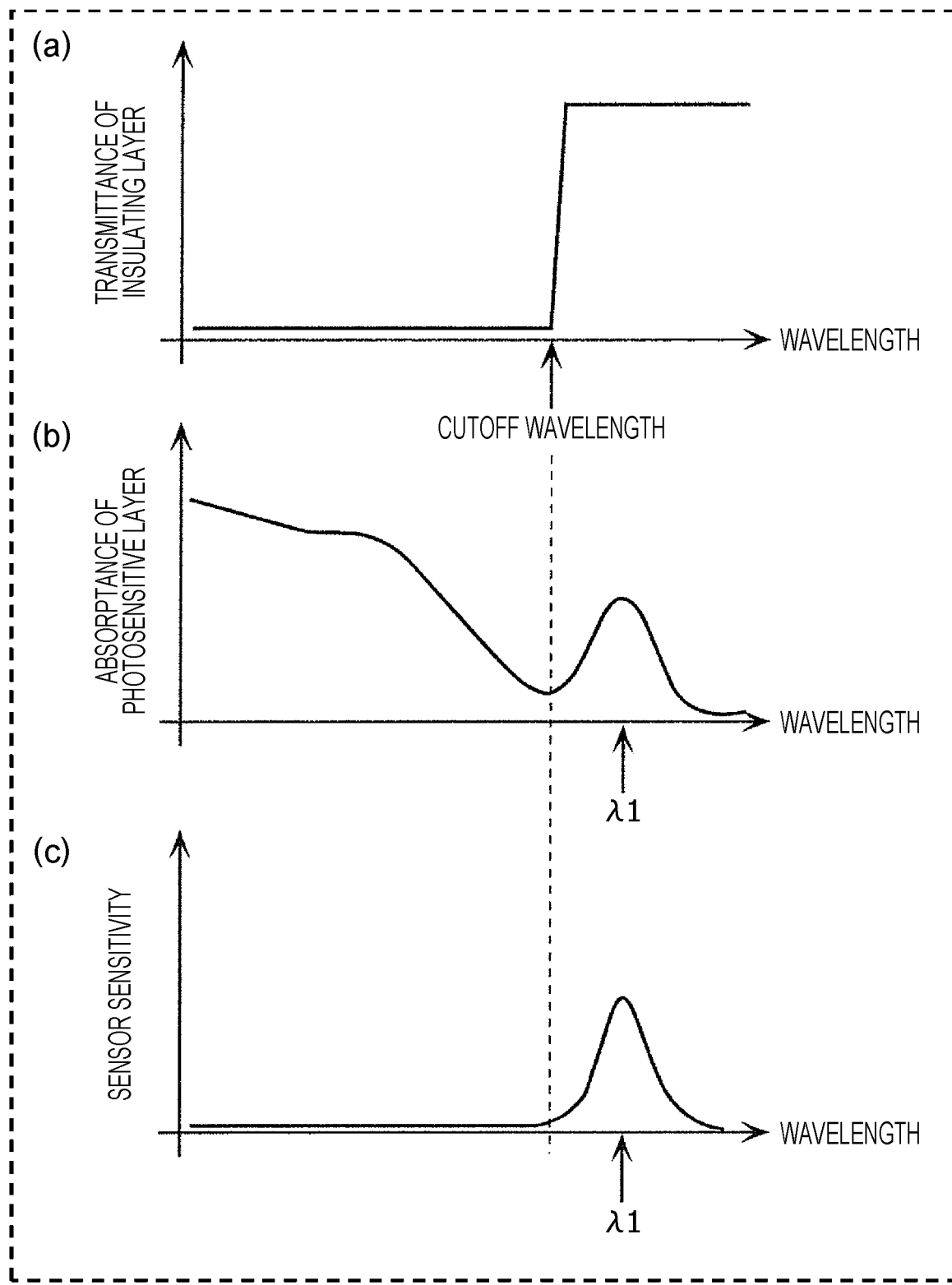
FIG. 11 includes diagrams illustrating the transmittance and sensor sensitivity of each layer of the optical sensor according to the fourth embodiment.

FIG. 11 includes diagrams illustrating the transmittance and sensor sensitivity of each layer of the optical sensor 400 according to the present embodiment. Specifically, portion (a) of FIG. 11 illustrates the transmittance of the insulating layer 450. Portion (b) of FIG. 11 illustrates the absorptance of the photosensitive layer 140. Portion (c) of FIG. 11 illustrates the sensitivity of the optical sensor 400. In each diagram, the horizontal axis denotes wavelength.

As illustrated in portion (a) of FIG. 11, the insulating layer 450 functions as, for example, a long-pass filter. Specifically, the insulating layer 450 has a low transmittance in a wavelength region shorter than the cutoff wavelength and a high transmittance in a wavelength region longer than the cutoff wavelength. The insulating layer 450 with such characteristics is formed by, for example, mixing a certain amount of pigment or dye serving as the pigment 451 with an insulating resin and applying the mixture to form a film. Alternatively, the insulating layer 450 may have a multilayer structure including the insulating layer 150 according to the first or second embodiment and a light absorbing film that absorbs light in a specific wavelength range.

As illustrated in portion (b) of FIG. 11, in the case where the photosensitive layer 140 includes PbS quantum dots, the photosensitive layer 140 has broad absorption in the visible light region, and has an exciton absorption peak wavelength $\lambda 1$ that arises from the size effect on the longest wavelength side. In the case where it is attempted to realize narrow-band imaging near the wavelength $\lambda 1$ by using the photosensitive layer 140 with such light absorption characteristics, light in a wavelength range shorter than the wavelength $\lambda 1$ is also absorbed by the photosensitive layer 140, which may cause noise. In the present embodiment, the insulating layer 450 with transmittance characteristics illustrated in portion (a) of FIG. 11 is arranged on the light incidence surface side of the photosensitive layer 140. Accordingly, of light incident on the optical sensor 400, a component with a wavelength shorter than the cutoff wavelength is removed by the insulating layer 450; as a result, as illustrated in portion (c) of FIG. 11, the wavelength sensitivity characteristics of the optical sensor 400 are limited to a narrow wavelength range near the wavelength $\lambda 1$. If the quantum efficiency which serves as the sensor sensitivity is, for example, 10% or greater, a good imaging result may be obtained. It is thus only necessary to appropriately design the material or thickness of the photosensitive layer 140 and/or the material of the insulating layer 450 and the pigment 451 so that the quantum efficiency of the wavelength λ1 will be 10% or greater.

As described above, according to the optical sensor 400 according to the present embodiment, even in the case where light with a wavelength shorter than the cutoff wavelength is mixed in ambient light, noise caused by such light may be reduced, thereby realizing imaging in a desired narrowband.

Fifth Embodiment

Figure 12:
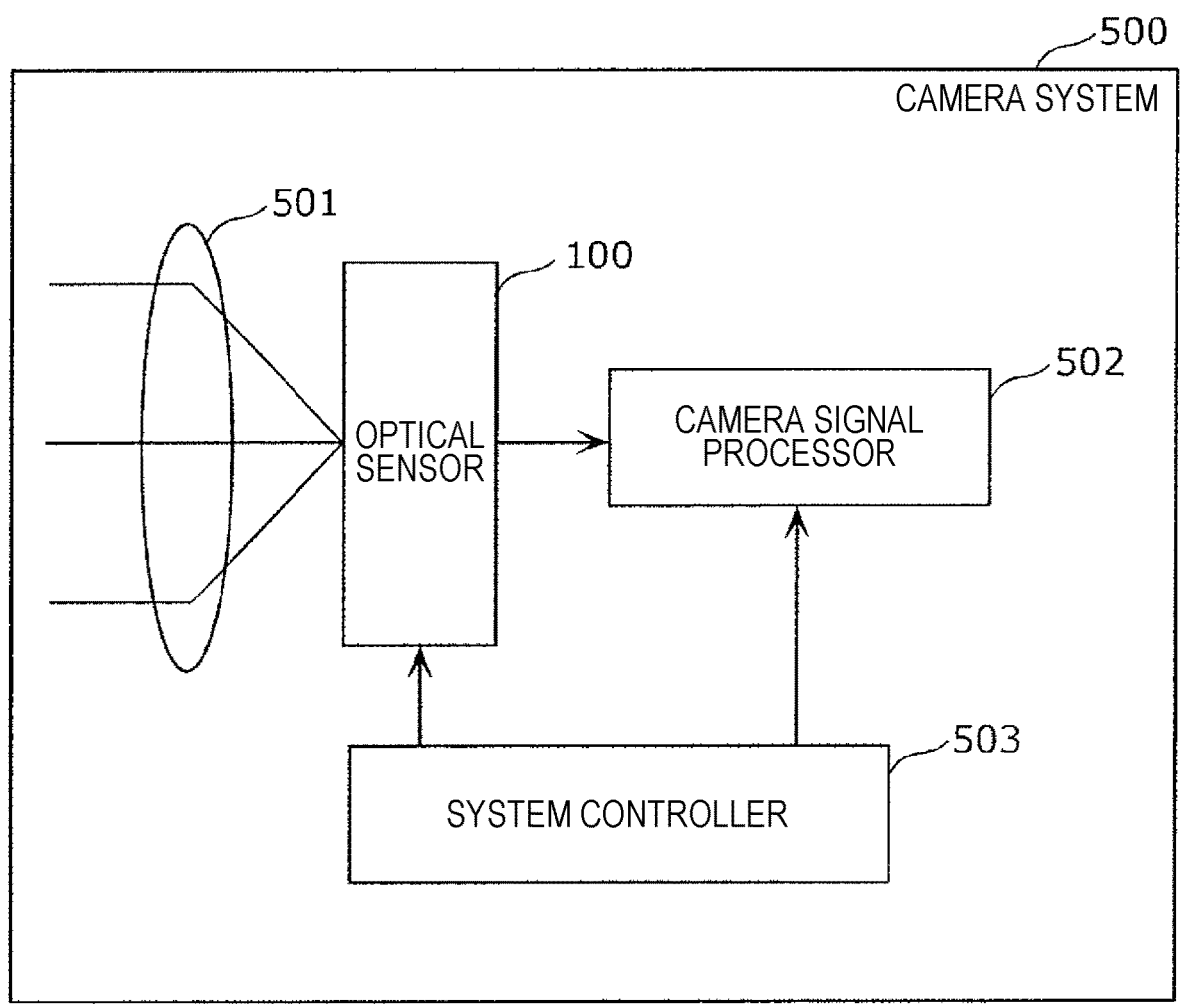
FIG. 12 is a block diagram illustrating the configuration of a camera system according to a fifth embodiment.

Hereinafter, a camera system according to a fifth embodiment will be described. FIG. 12 is a block diagram of a camera system 500 according to the present embodiment.

As illustrated in FIG. 12, the camera system 500 includes a lens optical system 501, the optical sensor 100, a camera signal processor 502, and a system controller 503. The optical sensor 100 is the optical sensor 100 described in the first embodiment. Instead of the optical sensor 100, the camera system 500 may include the optical sensor 200, 300, or 400 according to the second, third, or fourth embodiment.

The lens optical system 501 includes, for example, an autofocus lens, a zoom lens, and a diaphragm. The lens optical system 501 focuses light on the light receiving surface of the optical sensor 100.

The system controller 503 controls the entire camera system 500. The system controller 503 may be realized by, for example, a microcomputer.

The camera signal processor 502 functions as a signal processing circuit that processes an output signal from the optical sensor 100. The camera signal processor 502 performs processing such as gamma correction, color interpolation processing, spatial interpolation processing, and white balance processing. The camera signal processor 502 may be realized by, for example, a digital signal processor (DSP).

According to the camera system 500 according to the present embodiment, noise may be reduced by using the optical sensor 100 according to the above-described embodiment. As a result, power consumption may be reduced, and an image with good image quality may be generated.

Other Embodiments

Although the optical sensor according to one or more aspects has been described above on the basis of the embodiments, the present disclosure is not limited to these embodiments. The present disclosure includes an embodiment obtained by applying various modifications conceivable by those skilled in the art to the embodiments and an embodiment obtained by combining components in different embodiments without departing from the scope of the present disclosure.

In addition, various changes, replacements, additions, and/or omissions may be applied to each of the above-described embodiments within the scope of the claims or their equivalents.

The optical sensor according to the present disclosure is applicable to highly-sensitive imaging using an infrared wavelength in various camera systems and sensor systems, such as medical cameras, surveillance cameras, vehicle-mounted cameras, ranging cameras, microscope cameras, drone cameras, and robot cameras.

What is claimed is:

1. An optical sensor comprising:
a photosensitive layer that absorbs incident light to generate a first carrier with a first polarity and a second carrier with a second polarity different from the first polarity;
at least two channel layers that are electrically connected to the photosensitive layer and that conduct the first carrier that has moved from the photosensitive layer, the at least two channel layers being electrically insulated from each other;
a counter electrode facing the at least two channel layers through the photosensitive layer;
an insulating layer positioned between the photosensitive layer and the counter electrode;
source electrodes each electrically connected to a corresponding one of the at least two channel layers; and
drain electrodes each electrically connected to a corresponding one of the at least two channel layers.

2. The optical sensor according to claim 1, further comprising:
a carrier selecting layer that is positioned between the at least two channel layers and the photosensitive layer and that suppresses movement of the second carrier from the at least two channel layers to the photosensitive layer.

3. The optical sensor according to claim 1, further comprising:
a voltage supply circuit that supplies a first voltage to the counter electrode in a first period, and that supplies a second voltage different from the first voltage to the counter electrode in a second period different from the first period.

4. The optical sensor according to claim 1, wherein:
each of the at least two channel layers contains at least one selected from the group consisting of graphene, phosphorene, hexagonal boron nitride, transition metal dichalcogenide, and organic semiconductor.

5. The optical sensor according to claim 1, wherein:
the photosensitive layer includes a trap site that traps the second carrier.

6. The optical sensor according to claim 1, wherein:
the photosensitive layer includes a quantum dot.

7. The optical sensor according to claim 6, wherein:
the quantum dot contains at least one selected from the group consisting of Ge, CdSe, CdS, PbS, PbSe, PbTe, ZnO, ZnS, $Cu_2ZnSnS_4$, $Cu_2S$, $Bi_2S_3$, $Ag_2S$, HgTe, CdHgTe, InAs, and InSb.

8. The optical sensor according to claim 6, wherein:
at least part of a surface of the quantum dot is oxidized.

9. The optical sensor according to claim 1, wherein:
the photosensitive layer includes a carbon nanotube.

10. The optical sensor according to claim 1, wherein:
a wavelength range of light absorbed by the photosensitive layer includes a first wavelength range and a second wavelength range that is outside the first wavelength range,
a transmittance of the insulating layer for light in the first wavelength range is 10% or greater, and
a transmittance of the insulating layer for light in the second wavelength range is less than 10%.

11. The optical sensor according to claim 1, wherein:
the photosensitive layer and the at least two channel layers are configured so that the first carrier moves from the photosensitive layer to the at least two channel layers.

* * * * *